United States Patent
Wang

(10) Patent No.: US 10,359,705 B2
(45) Date of Patent: Jul. 23, 2019

(54) INDIRECT DETERMINATION OF A PROCESSING PARAMETER

(71) Applicant: ASML NETHERLANDS B.V., Veldhoven (NL)

(72) Inventor: Te-Sheng Wang, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/764,875

(22) PCT Filed: Sep. 21, 2016

(86) PCT No.: PCT/EP2016/072364
§ 371 (c)(1),
(2) Date: Mar. 29, 2018

(87) PCT Pub. No.: WO2017/063827
PCT Pub. Date: Apr. 20, 2017

(65) Prior Publication Data
US 2018/0321596 A1    Nov. 8, 2018

Related U.S. Application Data

(60) Provisional application No. 62/343,589, filed on May 31, 2016, provisional application No. 62/240,355, filed on Oct. 12, 2015.

(51) Int. Cl.
*G03F 7/20* (2006.01)
*H01L 21/66* (2006.01)
*H01L 21/027* (2006.01)

(52) U.S. Cl.
CPC ...... *G03F 7/70625* (2013.01); *G03F 7/70558* (2013.01); *G03F 7/70641* (2013.01); *H01L 21/0274* (2013.01); *H01L 22/12* (2013.01)

(58) Field of Classification Search
CPC ............ G03F 7/70625; G03F 7/70633; G03F 7/70641
(Continued)

(56) References Cited

U.S. PATENT DOCUMENTS 6,609,086 B1   8/2003   Bao et al.
2005/0221207 A1   10/2005   Nagatomo et al.
(Continued)

FOREIGN PATENT DOCUMENTS

EP   1721218   4/2012
WO   2014/201396   12/2014
WO   2016/096668   6/2016

OTHER PUBLICATIONS

International Search Report and Written Opinion dated Nov. 22, 2016 in corresponding International Patent Application No. PCT/EP2016/072364.
(Continued)

*Primary Examiner* — Hung Nguyen
(74) *Attorney, Agent, or Firm* — Pillsbury Winthrop Shaw Pittman LLP

(57) ABSTRACT

A method including measuring a value of a directly measureable processing parameter of a patterning process from a portion of a substrate produced by the patterning process; obtaining a relationship between the directly measureable processing parameter and a not directly measureable processing parameter; and determining a value of the not directly measureable processing parameter from the value of the directly measureable processing parameter and the relationship.

20 Claims, 12 Drawing Sheets

(58) Field of Classification Search
USPC .............................................. 355/52, 53, 55
See application file for complete search history.

(56) References Cited

U.S. PATENT DOCUMENTS

| | | | |
|---|---|---|---|
| 2011/0231167 A1* | 9/2011 | Cramer | G03B 27/52 703/2 |
| 2011/0295555 A1 | 12/2011 | Meessen et al. | |
| 2016/0116849 A1* | 4/2016 | Cramer | G03F 7/70625 355/67 |
| 2016/0370717 A1* | 12/2016 | Den Boef | G03F 7/70633 |
| 2017/0060001 A1* | 3/2017 | Adel | H01L 22/30 |
| 2017/0109646 A1* | 4/2017 | David | G03F 7/705 |

OTHER PUBLICATIONS

Yishai, Michael Ben et al., "An IntenCD map of a reticle as a feed-forward input to DoseMapper", Proceedings of SPIE, vol. 7028, pp. 70283H-1-70283H-11, (2008).

* cited by examiner

INDIRECT DETERMINATION OF A PROCESSING PARAMETER

CROSS-REFERENCE TO RELATED APPLICATIONS

This application is the U.S. national phase entry of PCT patent application no. PCT/EP2016/072364, which was filed on Sep. 21, 2016, which claims the benefit of priority of U.S. provisional application No. 62/240,355, which was filed on Oct. 12, 2015, and U.S. provisional application No. 62/343,589,which was filed on May 31, 2016, each of which is incorporated herein in its entirety by reference.

FIELD

The present disclosure relates to a method of improving the performance of a patterning process, such as a semiconductor manufacturing process. The method may be used in connection with a lithographic apparatus.

BACKGROUND

A lithography apparatus is a machine that applies a desired pattern onto a target portion of a substrate. Lithography apparatus can be used, for example, in the manufacture of integrated circuits (ICs). In that circumstance, a patterning device, which is alternatively referred to as a mask or a reticle, may be used to generate a pattern corresponding to, for example, an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithography apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction.

Prior to transferring a pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemical-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

In order to monitor one or more steps of the patterning process, the patterned substrate is inspected and one or more parameters of the patterned substrate are measured. The one or more parameters may include, for example, the overlay error between successive layers formed in or on the patterned substrate, a focus used to expose a pattern onto the substrate, a dose used to expose a pattern onto the substrate, and/or a critical dimension (e.g., linewidth) of a pattern formed on the substrate. This measurement may be performed on a target of the device product part of the substrate itself and/or on a dedicated metrology target provided on the substrate. There are various techniques for making measurements of the microscopic structures formed in lithography processes, including the use of a scanning electron microscope and/or various specialized measurement tools.

SUMMARY

Disclosed herein is a method, comprising: measuring values of one or more directly measureable processing parameters of a patterning process from a portion of a substrate produced by the patterning process, the one or more directly measureable processing parameters comprising a characteristic of a feature that is part of a device designed to be functional; obtaining a relationship between the one or more directly measureable processing parameters and a not directly measureable processing parameter; and determining, by a computer system, a value of the not directly measureable processing parameter from the values of the one or more directly measureable processing parameters and the relationship.

According to an embodiment, the one or more directly measureable processing parameters comprise a critical dimension (CD) of a feature on the substrate.

According to an embodiment, the feature is a feature in a resist image on the substrate.

According to an embodiment, the feature is a hot spot.

According to an embodiment, the not directly measureable processing parameter is a focus at which the portion of the substrate is exposed.

According to an embodiment, the not directly measureable processing parameter is a dose at which the portion of the substrate is exposed.

According to an embodiment, the relationship is retrieved from a database, established by an experiment or established by simulation.

According to an embodiment, the value of the not directly measureable processing parameter is determined from a median of the values of the one or more directly measureable processing parameters.

According to an embodiment, the portion has a higher probability of containing a defect than a threshold.

According to an embodiment, the portion contains a hot spot.

According to an embodiment, the values of the one or more directly measureable processing parameters are measured from one or more features in the portion.

According to an embodiment, the method further comprises verifying the relationship.

According to an embodiment, verifying the relationship comprises obtaining an image of the portion.

According to an embodiment, the image is obtained by a scanning electron microscope or an electron beam inspection tool.

According to an embodiment, verifying the relationship comprises determining locations at which the values of the one or more directly measureable processing parameters are measured.

According to an embodiment, the method further comprises measuring the values of the one or more directly measureable processing parameters at the locations.

According to an embodiment, measuring the values of the one or more directly measureable processing parameters comprises extracting edge locations from the image.

According to an embodiment, the feature is not part of a metrology target.

Disclosed herein is a method of manufacturing devices wherein a device pattern is applied to a series of substrates using a patterning process, the method including measuring at least the device pattern on at least one of the substrates, using a method as described herein, and controlling the patterning process for later substrates in accordance with a value of a not directly measureable processing parameter determined by the method.

Disclosed herein is a system comprising: an inspection apparatus configured to provide a beam on a device pattern on a substrate and to detect radiation redirected by the device pattern; and a non-transitory computer program product as disclosed herein. In an embodiment, the system further comprises a lithographic apparatus, the lithographic apparatus comprising a support structure configured to hold a patterning device to modulate a radiation beam and a projection optical system arranged to project the modulated onto a radiation-sensitive substrate.

Disclosed herein is a method, comprising: obtaining values of a characteristic of a plurality of features or patterns formed on a substrate by a lithography process; obtaining a relationship between the characteristic and a processing parameter of the lithography process; determining values of the processing parameter for each of the features or patterns based on the values of the characteristic and the relationship; and determining, by a hardware computer system, a statistic characteristic from the values of the processing parameter.

According to an embodiment, the characteristic relates to geometry of the features or patterns.

According to an embodiment, the characteristic is a CD or normalized CD.

According to an embodiment, the characteristic relates locations of the features or patterns relative to the substrate or relative to one another.

According to an embodiment, the processing parameter comprises a dose of the features or patterns.

According to an embodiment, the processing parameter comprises a focus of the features or patterns.

According to an embodiment, the statistic characteristic is a mean, a variance or standard deviation of the values of the processing parameter.

According to an embodiment, the method further comprises obtaining a further statistic characteristic from values of the processing parameter for features or patterns formed by the same lithography process or a further lithography process.

According to an embodiment, the method further comprises determining whether the statistic characteristic and the further statistic characteristic satisfy, or do not satisfy, a criterion.

According to an embodiment, the method further comprises adjusting or calibrating a lithography process if the statistic characteristic and the further statistic characteristic satisfy, or do not satisfy, the criterion.

Disclosed herein is a computer program product comprising a computer readable medium having instructions recorded thereon, the instructions when executed by a computer implementing any of the methods disclosed herein.

DETAILED DESCRIPTION

Figure 1:
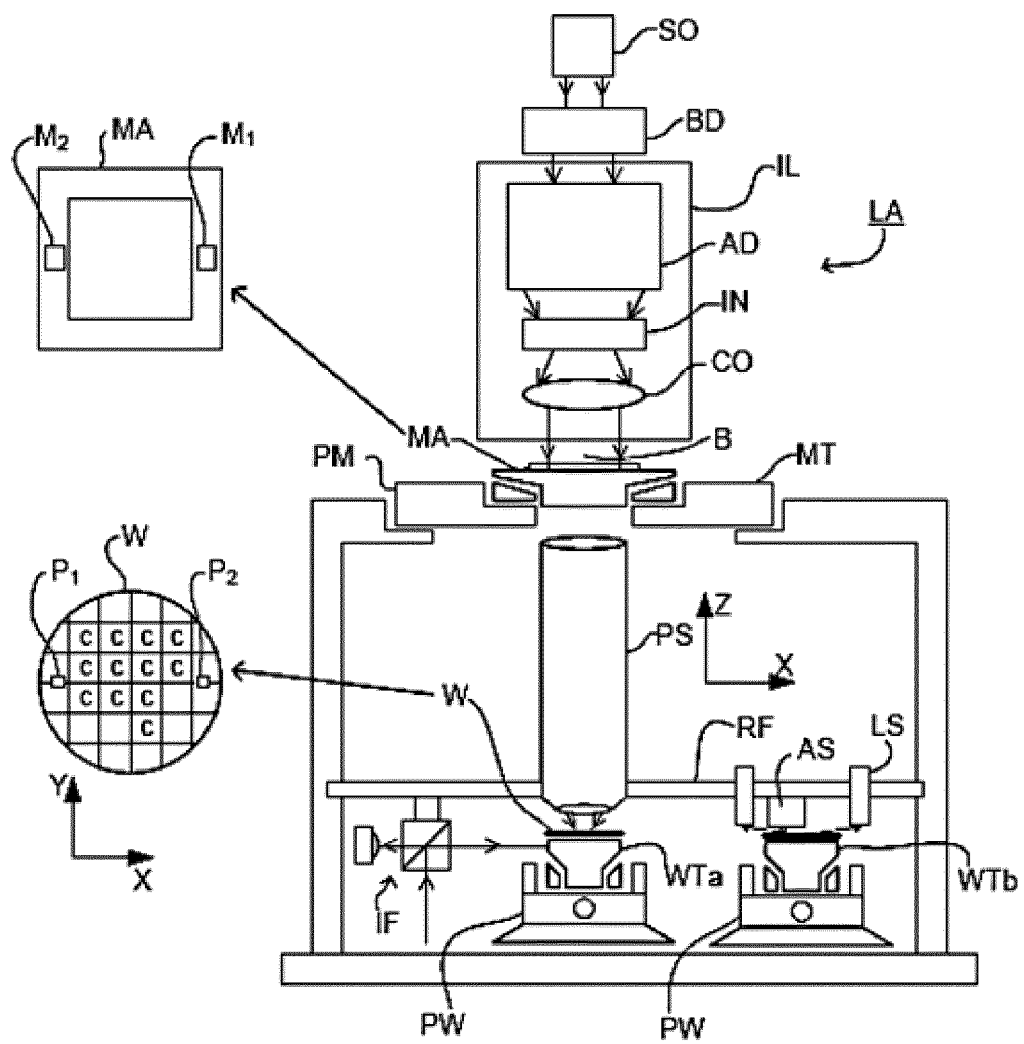
FIG. 1 schematically depicts a lithography apparatus according to an embodiment.

FIG. 1 schematically depicts a lithographic apparatus LA. The apparatus comprises:

- an illumination system (illuminator) IL configured to condition a radiation beam B (e.g. DUV radiation or EUV radiation);
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WTa constructed to hold a substrate (e.g. a resist-coated wafer) W and connected to a second positioner PW configured to accurately position the substrate in accordance with certain parameters; and
- a projection system (e.g. a refractive or reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support structure MT holds the patterning device in a manner that depends on the orientation of the patterning device, the design of the lithographic apparatus, and other conditions, such as for example whether or not the patterning device is held in a vacuum environment. The patterning device support structure can use mechanical, vacuum, electrostatic or other clamping techniques to hold the patterning device. The patterning device support structure may be a frame or a table, for example, which may be fixed or movable as required. The patterning device support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable minor arrays, and programmable LCD panels. Masks are well known in lithography, and include mask types such as binary, alternating phase-shift, and attenuated phase-shift, as well as various hybrid mask types. An example of a programmable minor array employs a matrix arrangement of small mirrors, each of which can be individually tilted so as to reflect an incoming radiation beam in different directions. The tilted mirrors impart a pattern in a radiation beam, which is reflected by the minor matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The illumination system and/or projection system may encompass various types of optical components, including refractive, reflective, and catadioptric optical components for directing, shaping, or controlling the beam of radiation, and such components may also be referred to below, collectively or singularly, as a "lens."

As here depicted, the apparatus is of a transmissive type (e.g., employing a transmissive mask). Alternatively, the apparatus may be of a reflective type (e.g., employing a programmable minor array of a type as referred to above, or employing a reflective mask).

The lithographic apparatus may be of a type having two (dual stage) or more tables (e.g., two or more substrate table, two or more patterning device support structures, or a substrate table and metrology table). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may alter the intensity distribution of the beam. The illuminator IL may include an adjuster AD configured to adjust the intensity distribution of the radiation beam. Generally, at least the outer and/or inner radial extent (commonly referred to as o-outer and o-inner, respectively) of the intensity distribution in a pupil plane of the illuminator can be adjusted. The illuminator may be arranged to limit the radial extent of the radiation beam such that the intensity distribution is non-zero within an annular region in a pupil plane of the illuminator IL. Additionally or alternatively, the illuminator IL may be operable to limit the distribution of the beam in the pupil plane such that the intensity distribution is non-zero in a plurality of equally spaced sectors in the pupil plane. The intensity distribution of the radiation beam in a pupil plane of the illuminator IL may be referred to as an illumination mode. The illuminator IL may be operable to vary the angular distribution of the beam. For example, the illuminator may be operable to alter the number, and angular extent, of sectors in the pupil plane wherein the intensity distribution is non-zero. By adjusting the intensity distribution of the beam in the pupil plane of the illuminator, different illumination modes may be achieved. For example, by limiting the radial and angular extent of the intensity distribution in the pupil plane of the illuminator IL, the intensity distribution may have a multi-pole distribution such as, for example, a dipole, quadrupole or hexapole distribution. A desired illumination mode may be obtained, e.g., by inserting an optic which provides that illumination mode into the illuminator IL or using a spatial light modulator.

The illuminator IL may be operable alter the polarization of the beam and may be operable to adjust the polarization using adjuster AD. The polarization state of the radiation beam across a pupil plane of the illuminator IL may be referred to as a polarization mode. The use of different polarization modes may allow greater contrast to be achieved in the image formed on the substrate W. The radiation beam may be unpolarized. Alternatively, the illuminator may be arranged to linearly polarize the radiation beam. The polarization direction of the radiation beam may vary across a pupil plane of the illuminator IL. The polarization direction of radiation may be different in different regions in the pupil plane of the illuminator IL. The polarization state of the radiation may be chosen in dependence on the illumination mode. For multi-pole illumination modes, the polarization of each pole of the radiation beam may be generally perpendicular to the position vector of that pole in the pupil plane of the illuminator IL. For example, for a dipole illumination mode, the radiation may be linearly polarized in a direction that is substantially perpendicular to a line that bisects the two opposing sectors of the dipole. The radiation beam may be polarized in one of two different orthogonal directions, which may be referred to as X-polarized and Y-polarized states. For a quadrupole illumination mode the radiation in the sector of each pole may be linearly polarized in a direction that is substantially perpendicular to a line that bisects that sector. This polarization mode may be referred to as XY polarization. Similarly, for a hexapole illumination mode the radiation in the sector of each pole may be linearly polarized in a direction that is substantially perpendicular to a line that bisects that sector. This polarization mode may be referred to as TE polarization.

In addition, the illuminator IL generally comprises various other components, such as an integrator IN and a condenser CO. The illuminator provides a conditioned beam of radiation B, having a desired uniformity and intensity distribution in its cross section.

The radiation beam B is incident on the patterning device (e.g., mask) MA, which is held on the patterning device support (e.g., mask table) MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan. In general, movement of the patterning device support (e.g., mask table) MT may be realized with the aid of a long-stroke module (coarse positioning) and a short-stroke module (fine positioning), which form part of the first positioner PM. Similarly, movement of the substrate table WTa may be realized using a long-stroke module and a short-stroke module, which form part of the second positioner PW. In the case of a stepper (as opposed to a scanner) the patterning device support (e.g., mask table) MT may be connected to a short-stroke actuator only, or may be fixed.

Patterning device (e.g., mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks).

Similarly, in situations in which more than one die is provided on the patterning device (e.g., mask) MA, the patterning device alignment marks may be located between the dies. Small alignment markers may also be included within dies, in amongst the device features, in which case it is desirable that the markers be as small as possible and not require any different imaging or process conditions than adjacent features. The alignment system, which detects the alignment marks is described further below.

The projection system PS has an optical transfer function which may be non-uniform, which can affect the pattern imaged on the substrate W. For unpolarized radiation such effects can be fairly well described by two scalar maps, which describe the transmission (apodization) and relative phase (aberration) of radiation exiting the projection system PS as a function of position in a pupil plane thereof. These scalar maps, which may be referred to as the transmission map and the relative phase map, may be expressed as a linear combination of a complete set of basis functions. A particularly convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PS will have a different Zernike expansion for each field point (i.e. for each spatial location in its image plane). The relative phase of the projection system PS in its pupil plane may be determined by projecting radiation, for example from a point-like source in an object plane of the projection system PS (i.e. the plane of the patterning device MA), through the projection system PS and using a shearing interferometer to measure a wavefront (i.e. a locus of points with the same phase). A shearing interferometer is a common path interferometer and therefore, advantageously, no secondary reference beam is required to measure the wavefront. The shearing interferometer may comprise a diffraction grating, for example a two dimensional grid, in an image plane of the projection system (i.e. the substrate table WT) and a detector arranged to detect an interference pattern in a plane that is conjugate to a pupil plane of the projection system PS. The interference pattern is related to the derivative of the phase of the radiation with respect to a coordinate in the pupil plane in the shearing direction. The detector may comprise an array of sensing elements such as, for example, charge coupled devices (CCDs).

The diffraction grating may be sequentially scanned in two perpendicular directions, which may coincide with axes of a co-ordinate system of the projection system PS (x and y) or may be at an angle such as 45 degrees to these axes. Scanning may be performed over an integer number of grating periods, for example one grating period. The scanning averages out phase variation in one direction, allowing phase variation in the other direction to be reconstructed. This allows the wavefront to be determined as a function of both directions.

The projection system PS of a lithography apparatus may not produce visible fringes and therefore the accuracy of the determination of the wavefront can be enhanced using phase stepping techniques such as, for example, moving the diffraction grating. Stepping may be performed in the plane of the diffraction grating and in a direction perpendicular to the scanning direction of the measurement. The stepping range may be one grating period, and at least three (uniformly distributed) phase steps may be used. Thus, for example, three scanning measurements may be performed in the y-direction, each scanning measurement being performed for a different position in the x-direction. This stepping of the diffraction grating effectively transforms phase variations into intensity variations, allowing phase information to be determined. The grating may be stepped in a direction perpendicular to the diffraction grating (z direction) to calibrate the detector.

The transmission (apodization) of the projection system PS in its pupil plane may be determined by projecting radiation, for example from a point-like source in an object plane of the projection system PS (i.e. the plane of the patterning device MA), through the projection system PS and measuring the intensity of radiation in a plane that is conjugate to a pupil plane of the projection system PS, using a detector. The same detector as is used to measure the wavefront to determine aberrations may be used.

The projection system PS may comprise a plurality of optical (e.g., lens) elements and may further comprise an adjustment mechanism configured to adjust one or more of the optical elements so as to correct for aberrations (phase variations across the pupil plane throughout the field). To achieve this, the adjustment mechanism may be operable to manipulate one or more optical (e.g., lens) elements within the projection system PS in one or more different ways. The projection system may have a co-ordinate system wherein its optical axis extends in the z direction. The adjustment mechanism may be operable to do any combination of the following: displace one or more optical elements; tilt one or more optical elements; deform one or more optical elements and/or change an optical property (such as refractive index) of the one or more optical elements. Displacement of an optical element may be in any direction (x, y, z or a combination thereof). Tilting of an optical element is typically out of a plane perpendicular to the optical axis, by rotating about an axis in the x and/or y directions although a rotation about the z axis may be used for a non-rotationally symmetric aspherical optical element. Deformation of an optical element may include a low frequency shape (e.g. astigmatic) and/or a high frequency shape (e.g. free form aspheres). Deformation of an optical element may be performed for example by using one or more actuators to exert force on one or more sides of the optical element and/or by using one or more heat transfer elements to heat and/or cool one or more selected regions of the optical element. Change of an optical property (such as refractive index) of the one or more optical elements can be accomplished by heat transfer, irradiation, or supply of electricity to the one or more optical elements to cause one or more parts of one or more optical elements to change in terms of optical materials property (such as refractive index).

In general, it may not be possible to adjust the projection system PS to correct for apodization (transmission variation across the pupil plane). The transmission map of a projection system PS may be used when designing a patterning device (e.g., mask) MA for the lithography apparatus LA. Using a computational lithography technique, the patterning device MA may be designed to at least partially correct for apodization.

The depicted apparatus could be used in at least one of the following modes:

In step mode, the patterning device support (e.g., mask table) MT and the substrate table WTa are kept essentially stationary, while an entire pattern imparted to the radiation beam is projected onto a target portion C at one time (i.e., a single static exposure). The substrate table WTa is then shifted in the X and/or Y direction so that a different target portion C can be exposed. In step mode, the maximum size of the exposure field limits the size of the target portion C imaged in a single static exposure.

In scan mode, the patterning device support (e.g., mask table) MT and the substrate table WTa are scanned synchronously while a pattern imparted to the radiation beam is projected onto a target portion C (i.e., a single dynamic exposure). The velocity and direction of the substrate table WTa relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In another mode, the patterning device support (e.g., mask table) MT is kept essentially stationary holding a programmable patterning device, and the substrate table WTa is moved or scanned while a pattern imparted to the radiation beam is projected onto a target portion C. In this mode, generally a pulsed radiation source is employed and the programmable patterning device is updated as required after each movement of the substrate table WTa or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two tables WTa, WTb (e.g., two substrate tables) and two stations—an exposure station and a measurement station—between which the tables can be exchanged. For example, while a substrate on one table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS, both sensors being supported by a reference frame RF. If the position sensor IF is not capable of measuring the position of a table while it is at the measurement station as well as at the exposure station, a second position sensor may be provided to enable the positions of the table to be tracked at both stations. As another example, while a substrate on one table is being exposed at the exposure station, another table without a substrate waits at the measurement station (where optionally measurement activity may occur). This other table has one or more measurement devices and may optionally have other tools (e.g., cleaning apparatus). When the substrate has completed exposure, the table without a substrate moves to the exposure station to perform, e.g., measurements and the table with the substrate moves to a location (e.g., the measurement station) where the substrate is unloaded and another substrate is load. These multi-table arrangements enable a substantial increase in the throughput of the apparatus.

Figure 10:
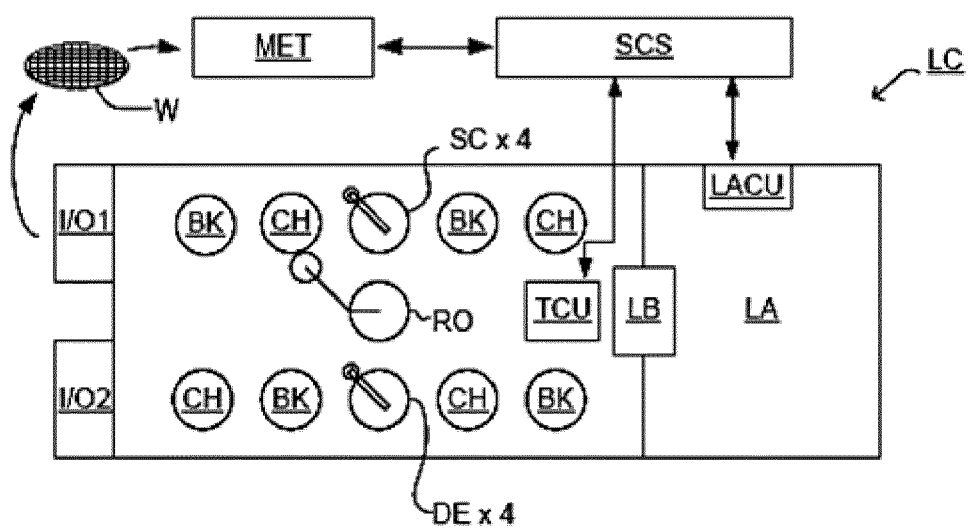
FIG. 10 schematically depicts an embodiment of a lithographic cell or cluster.

As shown in FIG. 10, the lithographic apparatus LA may form part of a lithographic cell LC, also sometimes referred to a lithocell or cluster, which also includes apparatuses to perform pre- and post-pattern printing processes on a substrate of a patterning process (i.e., a process of creating a pattern on a substrate that includes a step of printing the pattern and optionally one or more pre- or post-printing processes, and may include an optical lithography step, an imprint step, etching, resist application, resist development, baking, etc.). Conventionally these include one or more spin coaters SC to deposit one or more resist layers, one or more developers DE to develop printed resist, one or more chill plates CH and/or one or more bake plates BK. A substrate handler, or robot, RO picks up one or more substrates from input/output port I/O1, I/O2, moves them between the different process apparatuses and delivers them to the loading bay LB of the lithographic apparatus. These apparatuses, which are often collectively referred to as the track, are under the control of a track control unit TCU which is itself controlled by the supervisory control system SCS, which also controls the lithographic apparatus via lithography control unit LACU. Thus, the different apparatuses can be operated to maximize throughput and processing efficiency.

In order that a substrate that is processed by the lithographic apparatus is processed correctly and consistently, it is desirable to inspect a printed substrate to measure one or more properties such as overlay error between subsequent layers, line thickness, focus used to expose a substrate, a dose used to expose a substrate, critical dimension (CD), etc. Accordingly a manufacturing facility in which lithocell LC is located also typically includes a metrology system MET which receives some or all of the substrates W that have been processed in the lithocell. The metrology system MET may be part of the lithocell LC, for example it may be part of the lithographic apparatus.

Metrology results may be provided directly or indirectly to the supervisory control system SCS. If an error is detected, an adjustment may be made to processing of a subsequent substrate (especially if the inspection can be done soon and fast enough that one or more other substrates of the batch are still to be exposed) and/or to subsequent processing of the printed substrate. Also, an already printed substrate may be stripped and reworked to improve yield, or discarded, thereby avoiding performing further processing on a substrate known to be faulty. In a case where only some target portions of a substrate are faulty, further printing may be performed only on those target portions which are good.

Within a metrology system MET, an inspection apparatus is used to determine one or more properties of the substrate, and in particular, how one or more properties of different substrates vary or different layers of the same substrate vary from layer to layer. As noted above, the inspection apparatus may be integrated into the lithographic apparatus LA or the lithocell LC or may be a stand-alone device. To enable rapid measurement, it is desirable that the inspection apparatus measure one or more properties in the resist layer immediately after printing. However, in optical lithography, the latent image in the resist has a low contrast—there is only a very small difference in refractive index between the parts of the resist which have been exposed to radiation and those which have not—and not all inspection apparatus have sufficient sensitivity to make useful measurements of the latent image. Therefore measurements may be taken after a post-exposure bake step (PEB) which is customarily the first step carried out on an printed substrate and increases, for example, the contrast between exposed and unexposed parts of the resist. At this stage, the image in the resist may be referred to as semi-latent. It is also possible to make measurements of the developed resist image—at which point either printed or unprinted parts of the resist have been removed—or after a pattern transfer step such as etching. The latter possibility limits the possibilities for rework of a faulty substrate but may still provide useful information. In an embodiment, the inspection apparatus may be a scanning electron microscope. In an embodiment, the inspection apparatus may be diffraction-based measurement apparatus (e.g., a scatterometer).

Thus, a substrate undergoing a patterning process may be inspected during or after the patterning process. For example, the substrate may be inspected after it is exposed in a lithography apparatus such as that shown in FIG. 1. If the inspection determines that the substrate is defective, the substrate may be salvaged by reworking it and thus does not decrease the yield of the patterning process. The inspection may attempt to determine the values of one or more processing parameters associated with a step that has already occurred before the inspection. Parameters of the patterning process may be called "processing parameters." For example, post-exposure inspection may attempt to determine the focus, dose, and/or optical aberration at which a portion of the substrate is exposed. Not all processing parameters are always available for measurement. For example, one or more processing parameters may not be measurable in a particular patterning process, when, for example, the lithography apparatus is not equipped with a sensor that can measure those one or more parameters. Another situation is that at the time of measurement, the one or more processing parameters may no longer be available or prevail for direct measurement. For example, at the time of measurement, the one or more processing parameters to be measured may be associated with a particular step that has already been conducted. The values of these one or more processing parameters that cannot be directly measured can be determined from one or more other processing parameters, according to an embodiment.

Figure 2:
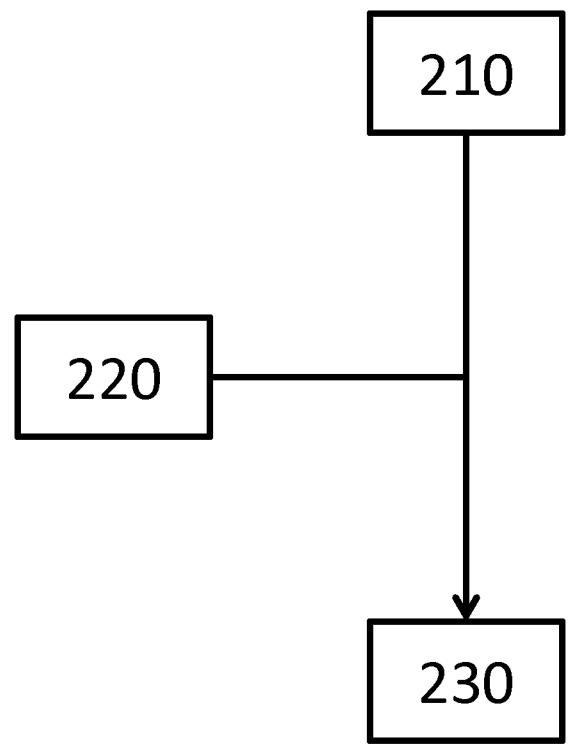
FIG. 2 schematically shows a flow according to an embodiment.

FIG. 2 schematically shows a flow according to an embodiment. In 210, the values of one or more processing parameters that are directly measureable from the substrate are measured. That a processing parameter is "directly measureable from the substrate" means that at the time of measurement the parameter is a characteristic of a physical object on the substrate. For example, the critical dimension (CD) of a feature in a resist image latent in a resist layer on the substrate is directly measureable after exposure and before removing the resist layer. The CD of the feature in the resist image becomes not directly measureable after etching the substrate and removing the resist layer. However, the CD of the feature in the resist image may be determined from the CD of the corresponding feature etched into the substrate. As another example, the focus under which the resist layer was exposed is not directly measureable after exposure but may be determined from the CD of a feature in a resist image exposed under that focus. Other examples of directly measureable processing parameters may include geometrical parameters such as a cross-sectional profile of a pattern on the substrate (e.g., sidewall angle, bottom surface slope, etc.), and statistical parameters such as defect number density, yield, line edge roughness, etc. The physical object may be a feature that will be part of a device designed to be functional rather than part of a metrology target. A feature that is a part of a device that is designed to be functional contributes to the function of the device designed to be functional while a metrology target does not. A metrology target is for monitoring the process of fabricating the device designed to be functional. A feature can be a component of a pattern (e.g., a line) or a pattern of its own as part of a larger pattern.

In 220, a relationship between one or more directly measureable processing parameters and a not directly measureable processing parameter is obtained. For example, the relationship may be retrieved from a database, may be established by an experiment, or may be established by simulation. In 230, the value of the not directly measureable processing parameter is determined from values of the one or more directly measureable processing parameters and the relationship. Once the value of the not directly measureable processing parameter is determined, adjustment to the patterning process or one or more apparatuses used in the patterning process (e.g., the lithography apparatus) may be made based on that value (e.g., for subsequent manufacturing of further substrates). The value of the not directly measureable processing parameter also may be used, for example, to determine whether the substrate is defective or should be reworked.

In one example, the one or more directly measureable processing parameters include CDs of features on the substrate (e.g., CDs of features in a resist image) and the not directly measureable processing parameter is the focus, dose and/or optical aberration under which the features were exposed.

Figure 3:
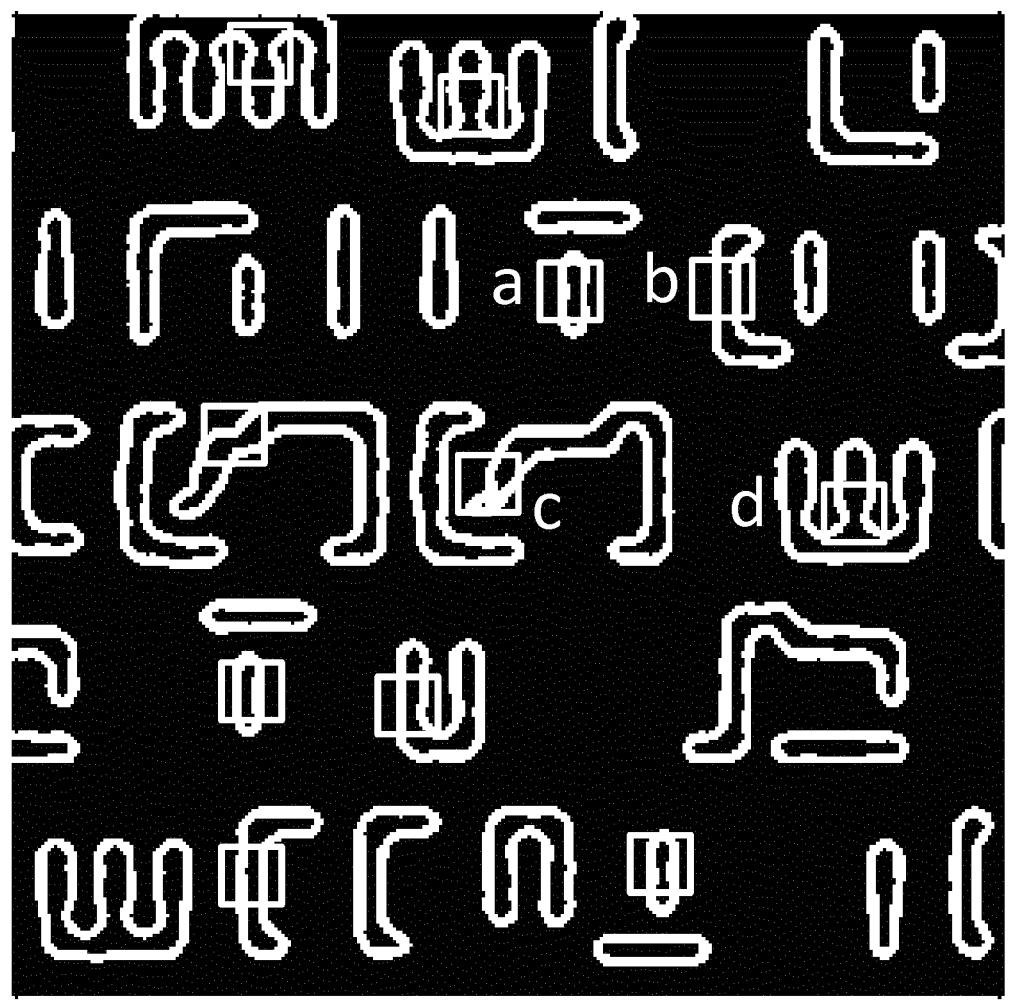
FIG. 3 shows an example of an image of a portion of a substrate, after exposure and development.

FIG. 3 shows an example of an image of a portion of a substrate, after exposure and development. The image is obtained from an electron beam inspection tool. CDs of the features in this portion may be directly measureable from the image. For example, CDs may be measured at the locations marked by the white squares. In an example, the image is compared against the design layout of this portion in order to identify the locations where CDs are to be measured. In an example, the features whose CDs are measured may be hot spots as described hereafter, which may be determined from the overlapping process window of the portion. The features in the portion may have different process windows (i.e., a space of the processing parameters under which a feature will be produced within specification). Examples of specifications that relate to potential systematic defects include checks for necking, line pull back, line thinning, CD, edge placement, overlapping, resist top loss, resist undercut and/or bridging. The process window of all the features in the portion may be obtained by merging (e.g., overlapping) process windows of each individual feature. The boundary of the process window of all the features contains boundaries of process windows of some of the individual features. These individual features that define the boundary of the process window of all the features limit the process window of all the features. These features can be referred to as "hot spots."

In an embodiment, the portion is an exposed die on the substrate. In an embodiment, the portion is a portion of an exposure die. That is, an embodiment, the exposure die may be subdivided into "pixels." Thus, the techniques herein may be repeated for each of the "pixels" of the die or a subset of such "pixels." In an embodiment, the portion is an exposure field (exposure slit) used to expose a die on the substrate. In an embodiment, the exposure field may be subdivided into "pixels." Thus, the techniques herein may be repeated for each of the "pixels" of the field or a subset of such "pixels." In an embodiment, the portion is selected from the range of 0.001 to 20 square microns, e.g. in the range of 0.001-10 square microns or in the range of 0.02-5 square microns.

Figure 4:
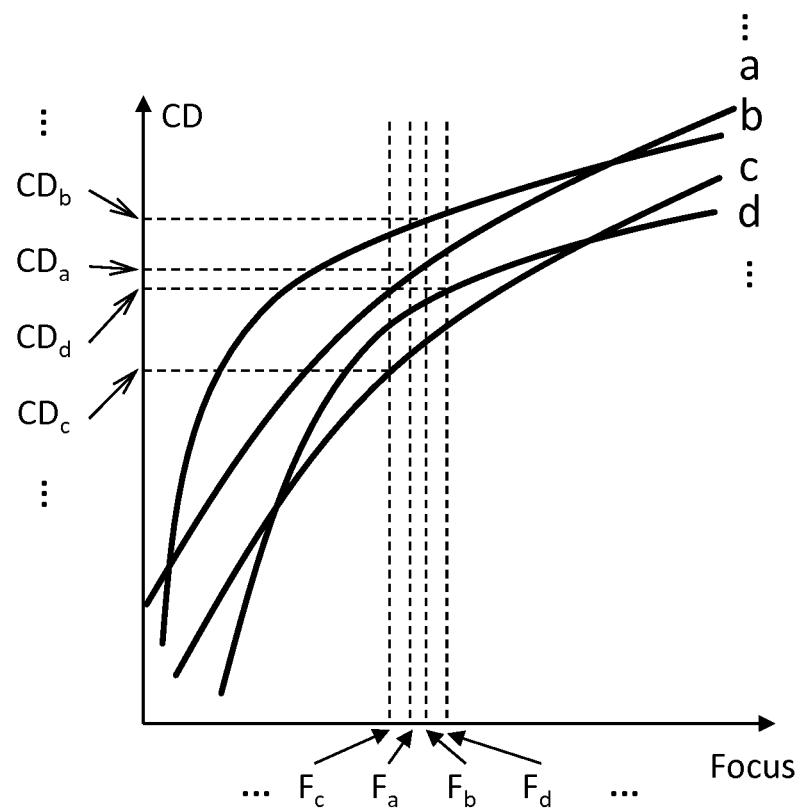
FIG. 4 shows examples of relationships between CD and focus for four features a, b, c and d.

FIG. 4 shows examples of relationships (i.e., the lines depicted) between CD and focus for four features a, b, c and d among those features in the portion of the substrate. That is the four features a, b, c and d were made under the substantially same process conditions on the substrate. The relationships may be obtained by simulation of CDs at different values of focus (e.g., an aerial mathematical model can determine an aerial image of a patterning device pattern as exposed by the projection system and a resist mathematical model can determine the pattern in a resist layer based on the aerial image). The relationships may be obtained by querying a database. The relationships may be obtained empirically. The relationships need not be a graphed line; rather, the relationship may be a mathematical formula, a mathematical fitting to simulated or measured data, a table of corresponding data within which interpolations/extrapolations are made, etc.

The CDs ($CD_a$, $CD_b$, $CD_c$ and $CD_d$, respectively) of the features a, b, c and d are measured from the image in FIG. 3 and the relationships can be used to determine the values ($F_a$, $F_b$, $F_c$ and $F_d$, respectively) of focus, under which the features a, b, c and d were produced. For example, the value $F_a$ is the horizontal coordinate of the point on the curve representing the relationship for feature a that has the vertical coordinate of $CD_a$. The values $F_a$, $F_b$, $F_c$ and $F_d$ may not be exactly the same because the relationships may have errors, the values of CD may have errors and/or the focuses under which features a, b, c and d were exposed may be slightly different. The value of focus for the portion may be derived from values $F_a$, $F_b$, $F_c$ and $F_d$. For example, the median of all the values of focus so determined in the portion may be considered the value of focus for the portion.

Figure 5:
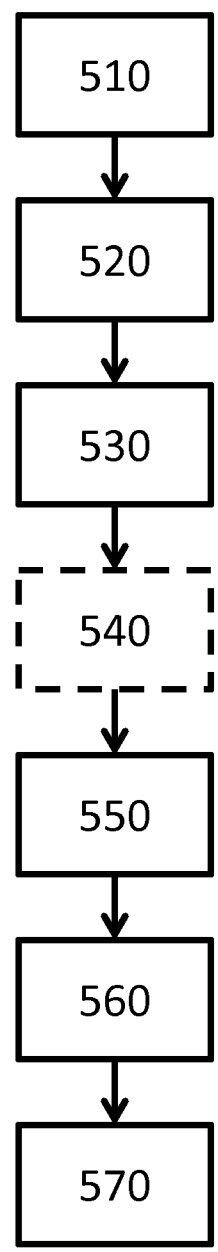
FIG. 5 shows a flow chart for an example method, according to an embodiment.

FIG. 5 shows a flow chart for an example method, according to an embodiment. In 510, a portion of the substrate subject to inspection is identified. The portion may be among those that have a higher probability of containing a defect than a threshold. For example, the portion may be one containing a hot spot. The portion may be selected by an operator of the patterning process. In 520, one or more features (desirably a plurality of features) are selected from the portion. The one or more selected features may include one or more hot spots. In 530, a relationship, for each of the one or selected features, between the CD of the one or more selected features and focus (as an example of a not directly measureable processing parameter) under which the applicable selected feature is exposed is obtained. The one or more relationships may be obtained by simulation or empirically. In 540, the one or more relationships are optionally verified. In 550, a value of the CD of each of the one or more selected features is measured. In 560, a value of the focus for each of the one or more selected features may be determined from the one or more measured values of CD and the applicable relationship. In 570, the value of the focus for the portion may be determined from values of focus for the one or more selected features (desirably a plurality of features). For example, the median of the values of focus for a plurality of selected features may be considered the value of the focus for the portion. A similar flow can be applied to one or more other not directly measureable processing parameters such as dose and/or optical aberration.

Figure 6:
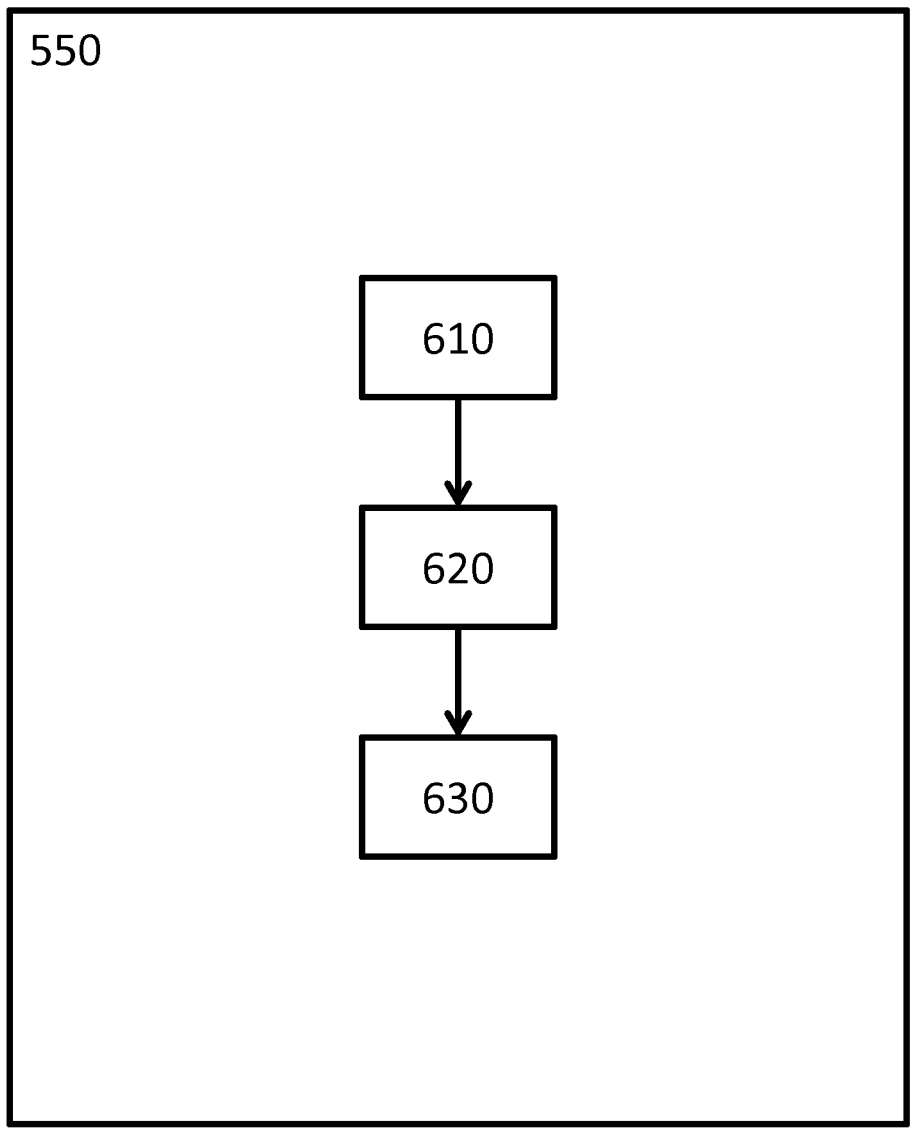
FIG. 6 shows an example of how the CDs of the selected features may be measured.

FIG. 6 shows an example of how the CD of the one or more selected features may be measured in 550. In 610, an image of the portion is obtained. For example, the image may be obtained by a scanning electron microscope or an electron beam inspection tool. In 620, the location of the one or more selected features for which the CD will be measured is determined. For example, the location may be determined by comparing the one or more selected features to the design layout and may be locations where defects are likely to occur (e.g., hotspots). In 630, the CD at these one or more locations is measured. For example, the CD may be measured by averaging the edge-to-edge distance in vicinities of the one or more locations. For example, the CD may be measured by extracting edge positions.

In an embodiment, an impact of one or more other not directly measureable processing parameters is mathematically removed when determining the not directly measureable processing parameter of interest. For example, if the not directly measurable processing parameter of interest is focus, the dose impact may be removed from the value of the directly measurable processing parameter (e.g., CD) when the value of the directly measurable processing parameter is combined with the relationship between the directly measurable processing parameter (e.g., CD) and the not directly measureable processing parameter of interest (e.g. focus). That may done by evaluating the sensitivity of the one or more features evaluated for the not directly measureable processing parameter of interest to the one or more other not directly measureable processing parameters through measurement of such one or more features when subject to a variation in the one or more other not directly measureable processing parameters.

In an embodiment, if determined values of the directly measureable processing parameter for each of a plurality of evaluated features vary significantly, then the median analysis may not be performed and an error signal is produced.

To identify the one or more features in the image corresponding to the relationship between the directly measurable processing parameter and the not directly measureable processing parameter of interest and for which one or more values of the directly measurable processing parameter are obtained, the design layout corresponding to the image may be compared with the image by, e.g., comparison of a plurality of measurements of structures in the image with related dimensions in the design layout, to identify the one or more features in the images. In an embodiment, a list of coordinates and/or shapes (e.g., a hotspot list) may be provided for the one or more features.

So, in an embodiment, a user can select one or more areas on product (i.e., on a device designed to be functional) for monitoring of the not directly measureable processing parameter (e.g., focus, dose, aberration, etc.). The area may be as small as an electron beam inspection imaging field (e.g., of a SEM). A simulation may be used to identify one or more hot spot features of those one or more areas that are sensitive to the not directly measureable processing parameter (e.g., focus, dose, aberration, etc.). In an embodiment, the simulation determines the relationship between one or more directly measureable processing parameters (e.g., CD) and the not directly measureable processing parameter for one or more features (e.g., the hot spot features) within the one or more areas. In an embodiment, one or more measurements are taken using the one or more features to determine or qualify the relationship (e.g., for a focus/CD relationship, the one or more features may be prepared at various defocus values and then the CD measured to create, calibrate and/or confirm the relationship).

Then, in an embodiment, an image of a device pattern formed on a substrate is measured (e.g., an electron beam inspection tool image capture). In an embodiment, values of one or more directly measureable processing parameters (e.g., CD) for the one or more features (e.g., the one or more hotspots) in the one or more selected areas in the image of the device pattern are determined. For example, in an embodiment, a die-to-(GDS)database (D2DB) system is used to determine CD values of the one or more features within the image. In an embodiment, the CD value could be found via simulation based on an extracted contour of the one or more features in the image.

Using the values of one or more directly measureable processing parameters (e.g., CD), an estimated value for the not directly measureable processing parameter (e.g., focus, dose, etc.) can be determined for each of the one or more features (e.g., each of the one or more hotspots). In an embodiment, a plurality of features is evaluated and thus a plurality of values of the not directly measureable processing parameter is obtained. In an embodiment, where a plurality of values are obtained for a plurality of features at different locations in the one or more areas, a median of the values for the not directly measureable processing parameter is obtained as a representation of a value for the not directly measureable processing parameter for one or more of the areas (e.g., the entire image). In an embodiment, electron beam inspection image capturing is relatively fast (e.g., ~10 ms for an area of 2×2 microns), and so it is possible to densely measure/monitor both interfield and intrafield on a production substrate.

The not directly measureable processing parameter may be used for various purposes, including monitoring of the one or more areas for, e.g., defects, substrate processing enhancement (e.g., determine focus impact on device features, determine the difference with readings for focus in the lithographic apparatus and evaluate whether the difference is systematic (e.g., through measuring a plurality of substrates with the same device pattern)), enable tool to tool matching (e.g., match focus impact on device features of one lithographic apparatus with another lithographic apparatus), feedback or feedforward control of the patterning process, determining a difference between delta between the not directly measureable processing parameter as determined from a monitored metrology and a device pattern, etc.

Advantageously, the technique herein may solve issues associated with one or more other monitoring techniques. For example, such other techniques may rely on a measurement from a large given area and/or outside of the device pattern; while the present technique is not necessarily so constrained. Further, for example, such other techniques rely on a metrology target that is fixed (e.g., in the patterning device field); while the present technique is not necessarily so constrained. Further, for example, such other techniques rely on a metrology target that may not meet customer OPC/design rules for patterning device production; while the present technique is not necessarily so constrained.

One or more statistical characteristics of a processing parameter may be used as an indicator of similarity, for example, between lithography apparatuses, or as indicators of the necessity of adjustment of, for example, a lithography apparatus or lithography process. For example, the doses of patterns received during an exposure may be used for these purposes. As explained above, the processing parameter may not be directly measureable but may be determined using a relationship with a directly measureable processing parameter.

Figure 7A:
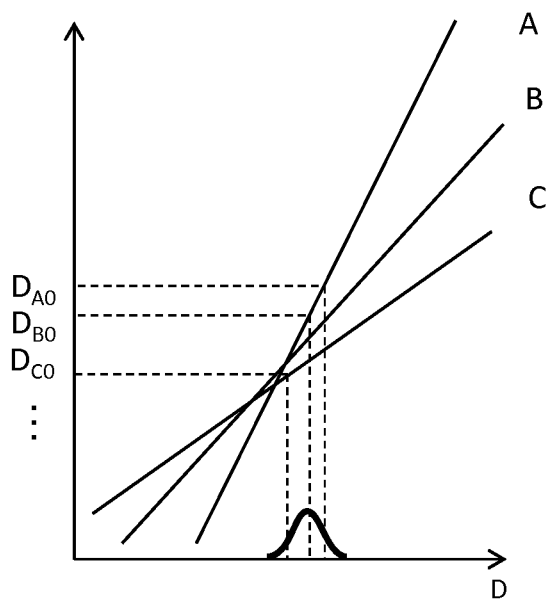
FIG. 7A shows relationships of normalized CD and dose for a plurality of patterns.

FIG. 7A shows relationships between normalized CD and dose for a plurality of features of a pattern. In an embodiment, the features are identified (e.g., through use of a simulation) as dose sensitive—their CD significantly varies in response to a change in dose, e.g., by having a CD to dose slope above a certain threshold. The plurality of features may include hot spots in an area at the substrate. For example, the area may be a device die exposed at the substrate or may be an exposure field of the lithography apparatus for a device die. The normalized CD is normalized with respect to the respective target CD of the features. The dose is the dose the features individually receive. The dose may not be the same for these features. The relationships may be obtained by simulating the normalized CD as a function of the dose. The features may be fabricated using a lithography process ("process A") onto a substrate and the CDs (e.g., $D_{A0}$, $D_{B0}$, $D_{C0}$) of these fabricated features may be obtained by measuring the substrate. Using the relationships (the three traces marked as A, B and C), the doses of the features may be determined. A statistical characteristic of the doses may be determined. For example, the statistical characteristic may be the mean of the doses, the variance of the doses, or the standard deviation of the doses.

Figure 7B:
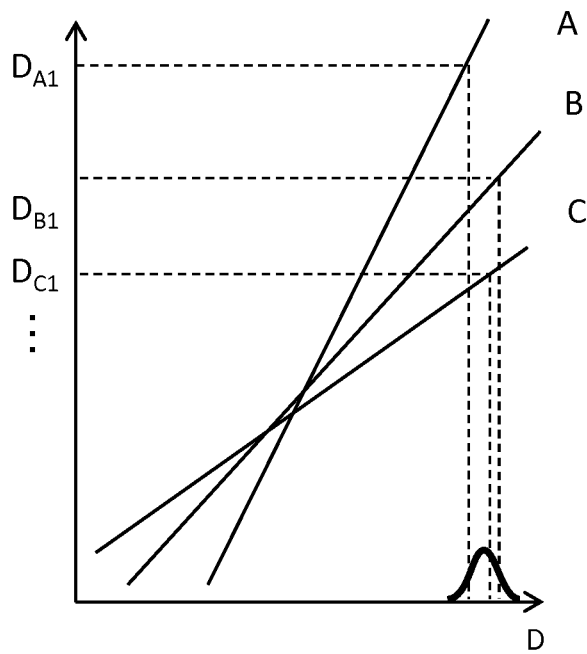
FIG. 7B shows that the same patterns may be fabricated using another lithography process onto another substrate.

FIG. 7B shows that the same features may be fabricated using a further lithography process ("process B") onto a substrate. In an embodiment the process A and process B may have essentially identical nominal lithography parameters. Thus, in an embodiment, process A may be a reference process, while process B is a production, development, etc. process. The CDs (e.g., $D_{A1}$, $D_{B1}$, $D_{C1}$) of these fabricated features may be obtained by measuring the substrate. Using the same relationships as in FIG. 7A (the three traces marked as A, B and C), the doses of the features may be determined. A statistical characteristic of the doses may be determined. For example, the statistical characteristic may be the mean of the doses, the variance of the doses, or the standard deviation of the doses.

The statistical characteristics can then be used for process and/or apparatus (including a patterning device and/or metrology target) modification, process and/or apparatus control, process and/or apparatus design, and/or process and/or apparatus monitoring. For example, the statistical characteristics may be used as an indicator of similarity between, for example, process A and process B or between the lithography apparatuses respectively used therein, or as an indicator of the necessity of adjustment of, for example, one or both of process A and process B, or the lithography apparatuses used therein. Further examples are presented hereafter.

Figure 7C:
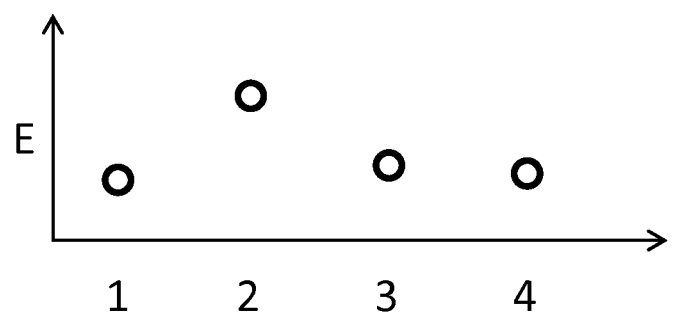
FIG. 7C schematically shows statistical characteristics (e.g., mean E and standard deviation o) of four different parts of a lithography process or of different lithography processes.
Figure 7C:
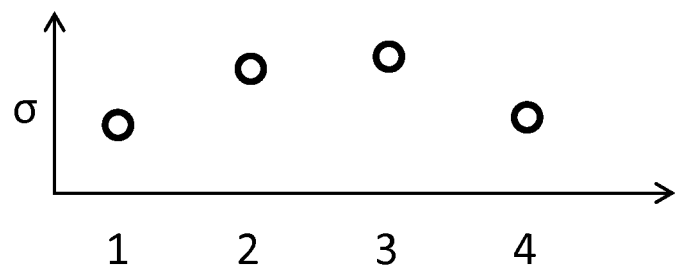

FIG. 7C schematically shows statistical characteristics (e.g., mean E and standard deviation σ) of four executions of one or more lithography processes (1, 2, 3 and 4). In an embodiment, each execution involves a lithography process having essentially identical nominal lithography parameters. Thus, in an embodiment, 1, 2, 3 and 4 may correspond to different substrates exposed using the lithography process or may correspond to different dies of a same substrate. Thus, in an embodiment, result 1 could be a reference against which results 2, 3 and 4 are compared. In an embodiment, each execution corresponds to part of the scanning of a substrate die using a lithographic process and thus 1, 2, 3 and 4 can correspond to the different positions along a width perpendicular to the scanning direction of the exposure field; in this manner, for example, dose uniformity across the exposure field can be evaluated. In an embodiment, 1, 2, 3 and 4 each correspond to a lithography process differing in a processing parameter; thus, result 1 could correspond to a reference lithography process. It can be seen, in FIG. 7C, that result 2 has a very different E and o from result 1; result 3 has similar E with result 1 but quite different o from result 1; result 4 has similar E and similar o with result 1. Therefore, result 4 is most similar to result 1 among results 1, 2 and 3. Thus, the results 1, 2, 3 and 4 can be analyzed to determine which one or more of results 1, 2, 3 and/or 4 are different in a statistically significant manner from one or more the other results 1, 2, 3 and/or 4. For example, a threshold can applied between the results to establish which one or more of the results 1, 2, 3 and/or 4 varies in a significant manner such that it indicates an error in the lithographic process (or part therefore) associated with the one or more results 1, 2, 3 and/or 4. Where result 1 is a reference, the analysis can focus on whether one or more results 2, 3 and/or 4 varies in a significant manner such that it indicates an error in the lithographic process (or part therefore) associated with the one or more results 2, 3 and/or 4.

Figure 8:
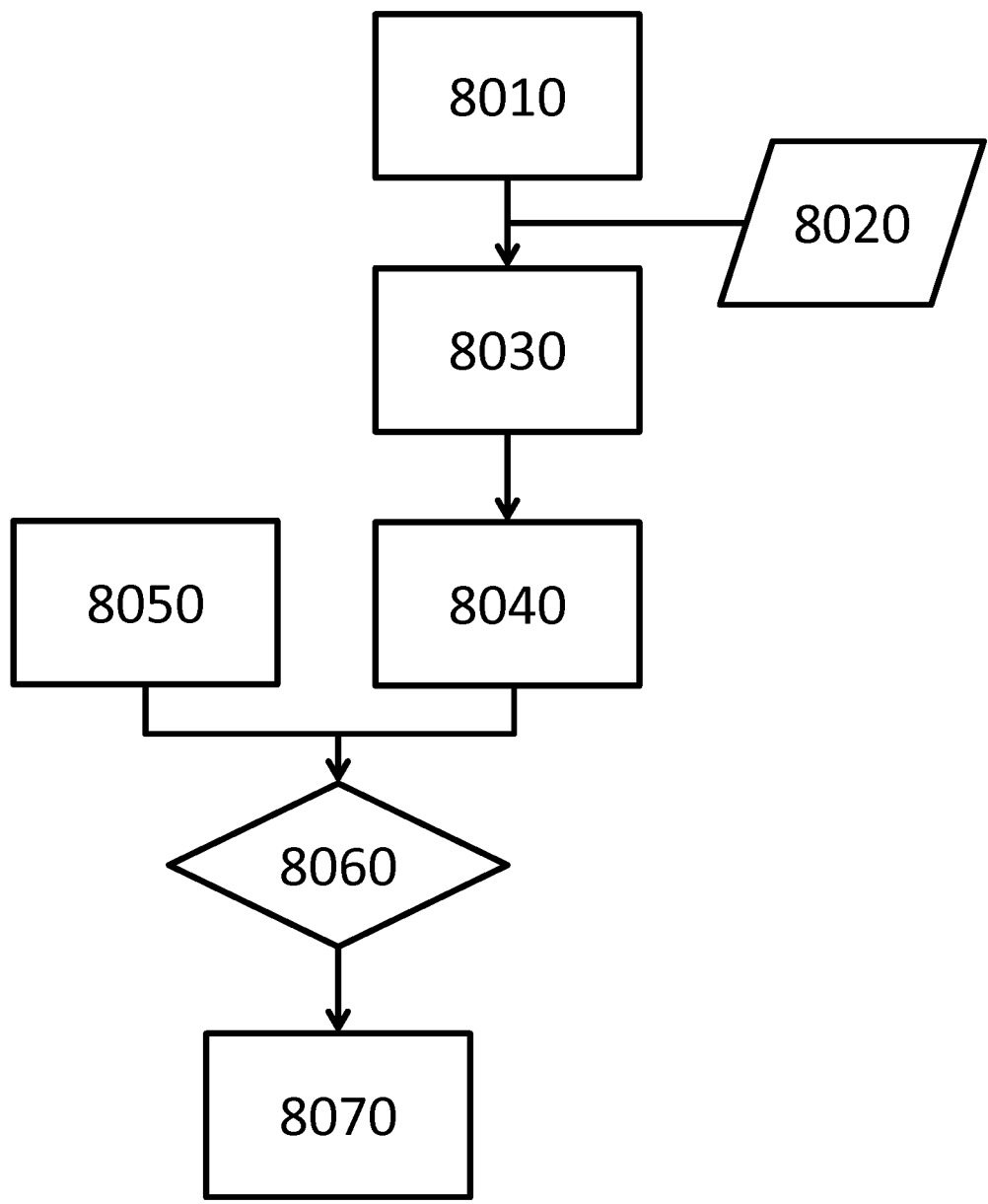
FIG. 8 schematically shows a flow for a method, according to an embodiment.

FIG. 8 schematically shows a flow for a method, according to an embodiment. In procedure 8010, values of a characteristic of a plurality of features are obtained, for example, by measuring the features. The characteristic may be one related to the geometry of the features such as a CD or normalized CD. The characteristic may be one related to the locations of the features relative to a substrate they are on or relative to one another. Using a relationship 8020 between the characteristic and a processing parameter (e.g., dose or focus), values 8030 of the processing parameter may be derived for the plurality of features. A statistic characteristic 8040 may be determined from the values 8030. The statistic characteristic 8040 may be compared with a statistic characteristic 8050 obtained from other values 8030. In procedure 8060, it is determined whether statistic characteristics 8040 and 8050 satisfy, or do not satisfy, a criterion. For example, the criterion may be that the absolute value of the difference between statistic characteristics 8040 and 8050 is below a threshold. If the criterion is not satisfied (or satisfied), in procedure 8070, the lithography process is adjusted or calibrated. For example, adjusting or calibrating the lithography process may include adjusting or calibrating a lithography apparatus used in the lithography process. Thus, in this embodiment, the values 8030 correspond to parts of the scanning of a substrate die using a lithographic process and thus the values can correspond to the different positions along a width in the scanning direction of the die or exposure field.

Figure 9:
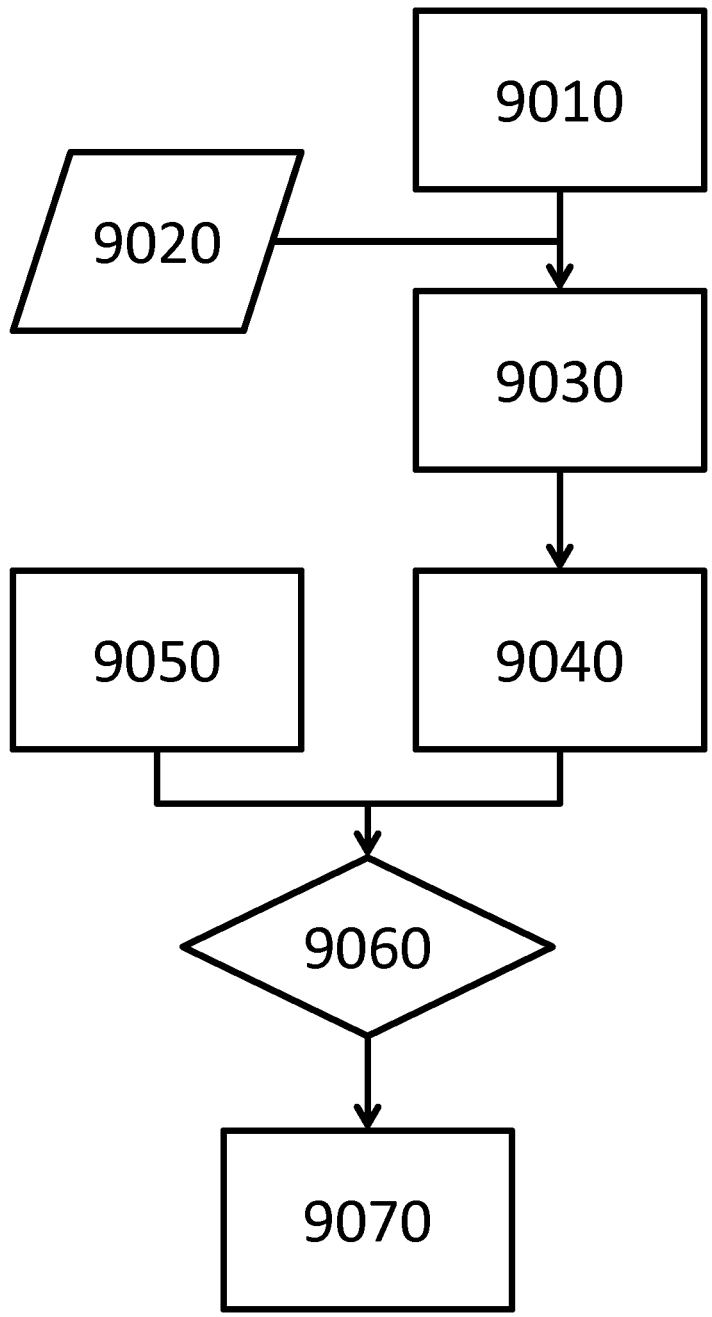
FIG. 9 schematically shows a flow for a method, according to an embodiment.

FIG. 9 schematically shows a flow for a method, according to an embodiment. In procedure 9010, values of a characteristic of a plurality of features fabricated by a lithography process are obtained, for example, by measuring the features. The characteristic may be one related to the geometry of the features such as a CD or normalized CD. The characteristic may be one related to the locations of the features relative to a substrate they are on or relative to one another. Using a relationship 9020 between the characteristic and a processing parameter (e.g., dose or focus), values 9030 of the processing parameter may be derived for the plurality of features. A statistic characteristic 9040 may be determined from the values 9030. The statistic characteristic 9040 may be compared with a statistic characteristic 9050 obtained from features fabricated by another lithography process. In procedure 9060, it is determined whether statistic characteristics 9040 and 9050 satisfy (or do not satisfy) a criterion. For example, the criterion may be that the absolute value of the difference between statistic characteristics 9040 and 9050 is below a threshold. If the criterion is not satisfied (or satisfied), in procedure 9070, one or more of the lithography processes are adjusted or calibrated. For example, adjusting or calibrating one or more of the lithography processes may include adjusting or calibrating a lithography apparatus used in this process(es). Thus, in this embodiment, each execution can involve a lithography process having essentially identical nominal lithography parameters. Thus, in an embodiment, values 9030 may correspond to different substrates exposed using the lithography process or may correspond to different dies of a same substrate. Thus, in an embodiment, certain values 9030 could be a reference against which other values 9030 are compared. In an embodiment, values 9030 correspond to different lithography processes differing in a processing parameter; thus, certain values 9030 could correspond to a reference lithography process.

In an embodiment, the values 8030 and/or 9030 can be correlated to one or more substrate lots, one or more patterning devices, one or more certain apparatuses used in the patterning process, one or more components in a lithographic apparatus, etc. to identify where an error could be occurring as a result of identifying that the criterion is, or is not, satisfied. With that information, a corrective action can be appropriately targeted.

Thus, this analysis can be used to determine whether a tool, such as the lithographic apparatus, is, e.g., drifting in performance, is performing incorrectly (or correctly), etc. A result of the analysis can then be used to take corrective action, such as using an adjustment apparatus within the lithographic apparatus (e.g., where the processing parameter is dose, an optical tool in a lithography apparatus can provide different dose corrections across the exposure field). Additionally or alternatively, this analysis can be used to match a first tool and against a second tool (where one or more results / values correspond to the first tool and one or more other results / values correspond to the second tool).

In an embodiment, a target value of a processing parameter (e.g., dose or focus) to produce a target value of a characteristic of each of a plurality of features sensitive to the processing parameter can be determined by computer simulation. These values can then be utilized to confirm the effectiveness of (and/or calibrate) a process and/or tool intended to correct the processing parameter (e.g., ASML's DoseMapper tool). For example, the process and/or tool can use targets that are limited in number and/or can have a different response to the processing parameter, and so their difference from features sensitive to the processing parameter can result in over/under compensation. Thus, although the plurality of features is not used for processing parameter correction in the process and/or tool, they can be used to monitor the process and/or tool (as well as be used to monitor the processing parameter as discussed above).

In particular, the plurality of features can then be created with a correction applied by the process and/or tool, the correction being set to create the plurality of features with the respective target value of the characteristic of each feature. The characteristic of the plurality of features can then be measured. If the process and/or tool are completely effective, the mean of the normalized characteristic of those targets should be equal to 1 and the sigma should be 0. Of course, a tolerance can be allowed. If the mean of the normalized characteristic of those targets is not equal to 1 (within a tolerance if applicable) and/or the sigma is not (within a tolerance if applicable), a correction could be made to the process and/or tool based on the measured characteristic and the relationship between the characteristic and the processing parameter. As another example, if the process and/or tool are not completely effective, a different monitoring value of the processing parameter can be set. For example, the measured characteristic can be used with the relationship between the characteristic and the processing parameter to arrive at value of the processing parameter. If the value of the processing parameter is about the same for each feature, the value of the processing parameter can be used as a basis for monitoring or control. Where they are not the same, a spatial finger print of the processing parameter across the exposure field, die, substrate, etc. can be used as a basis for monitoring or control.

In an embodiment, spatial finger print of the statistical characteristic, of the characteristic of the features and/or of derived values of the processing parameter across the exposure field, die, substrate, etc. can be determined based on the select plurality of features and used as a basis for monitoring or control. For example, a reference finger print can be determined and then one or subsequent finger prints can be compared against the reference finger print to arrive at a difference. The difference can be used as a basis for monitoring, control, etc.

Thus, in an embodiment, a plurality of features (for example, A, B, C in FIGS. 7A and 7B) that are sensitive to a parameter (e.g., dose, focus, etc.) is identified (for example, via computer simulation). Further, a relationship between a characteristic of the features (e.g., CD) and the parameter is identified (for example, via computer simulation). Further, in an embodiment, reference measurements of the features (for example, DA0, DB0, DC0 in FIGS. 7A and 7B) are performed on a substrate processed using a well calibrated patterning process (e.g., well calibrated lithography apparatus). From the relationships, corresponding values of the parameter (e.g., dose) for each feature can be determined and results in one or more statistical characteristics (e.g., mean and/or sigma) for monitoring as described hereafter. Further, measurements (for example, DA1, DB1, DC1 in FIGS. 7A and 7B) are taken of the features on, e.g., one or more production substrates. From the relationships, corresponding values of the parameter (e.g., dose) for each feature measured on, e.g., one or more production substrates can be determined and results in one or more statistical characteristics (e.g., mean and/or sigma). The statistical characteristics can then be compared to identify deviations. For example, the statistical characteristics can be populated on the same charts to identify deviations. For example, the statistical characteristics can be used for across exposure field monitoring of, e.g., target energy (dose). As another example, the across exposure field information can be available for each substrate of a plurality of substrates to monitor exposure field uniformity change. For example, the mean and/or sigma for a substrate (e.g., FIG. 7C where 1, 2, 3, 4 correspond to substrates) could indicate energy (dose) drift from a reference value. Then, across exposure field information (e.g., FIG. 7C where 1, 2, 3, 4 corresponds to across exposure field position) can identify the location of the problem. A user can specific one or more limits to trigger, e.g., calibration, on the fly correction, etc.

Thus, through the techniques herein, there can be effective monitoring of a processing parameter (and/or of a characteristic of a feature of a device pattern). For example, there can be provided effective exposure field and/or substrate die monitoring of an inline product substrate for CD, dose, focus, etc. This can be accomplished by evaluating features within the device pattern, such as features sensitive to the processing parameter. This can result in faster monitoring of production substrates. This can also lead to more productive use of a patterning process by, for example, identifying when calibration should be performed or inline corrections should be made.

In an embodiment, a feature used in the techniques herein (e.g., a hot spot feature that, e.g., is sensitive to a processing parameter such as dose and/or focus) could also suffer from issues or variability arising during the patterning process. For example, due to variability in the process, the feature may not closely reflect the relationship between a characteristic of the feature (e.g., CD) and a processing parameter (e.g., focus, dose, etc.). Additionally or alternatively, it may become defective and thus not yield relevant data of its one or more characteristics (e.g., its measured CD). So, in an embodiment, apart from possibly giving a warning regarding that specific feature (e.g., warning that the feature becomes a real defect), that feature can be filtered out from the features measured within the same area. Thus, the remaining features within the area could still be used to determine the processing parameter of the measured location. So, excluding certain features as just discussed above can enable more accurate processing parameter determination (e.g., by use of a plurality of "good" features in area on the device product pattern) and reporting of one or more defective features as well.

Figure 11:
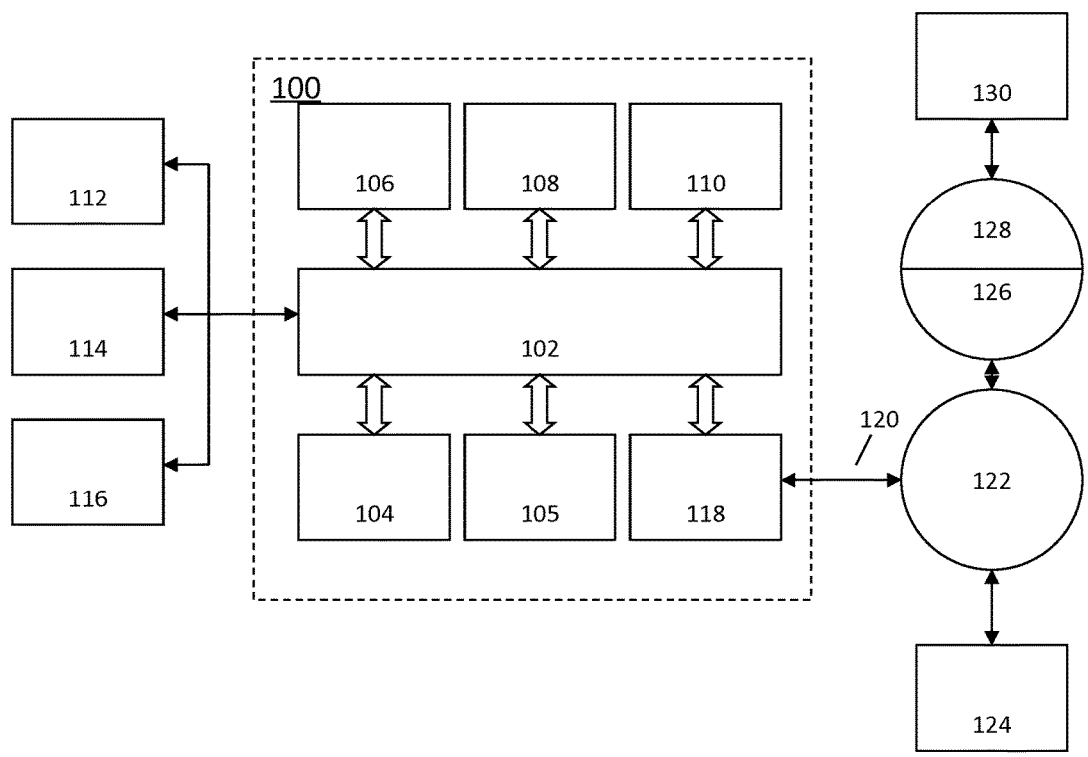
FIG. 11 is a block diagram of an example computer system.

FIG. 11 is a block diagram that illustrates a computer system 100 which can assist in implementing the methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of a process described herein may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hardwired circuitry may be used in place of or in combination with software instructions. Thus, the description herein is not limited to any specific combination of hardware circuitry and software.

Various forms of computer readable media may be involved in carrying one or more sequences of one or more instructions to processor 104 for execution. For example, the instructions may initially be borne on a computer readable medium of a remote computer. The remote computer can load the instructions into its dynamic memory and send the instructions over a communications line or wirelessly. Computer system 100 can receive the instructions and place the instructions on bus 102. Bus 102 carries the instructions to main memory 106, from which processor 104 retrieves and executes the instructions. The instructions received by main memory 106 may optionally be stored on storage device 110 either before or after execution by processor 104.

In an embodiment, computer system 100 includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding communications line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are example forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide for execution of an embodiment of a portion of process as described herein, for example. The received code may be executed by processor 104 as it is received, and/or stored in storage device 110, or other non-volatile storage for later execution. In this manner, computer system 100 may obtain application code in the form of a carrier wave.

The invention may further be described using the following clauses:

1. A method, comprising:
measuring a value of a directly measureable processing parameter of a patterning process from a portion of a substrate produced by the patterning process, the directly measureable processing parameter comprising a characteristic of a feature that is part of a device designed to be functional;
obtaining a relationship between the directly measureable processing parameter and a not directly measureable processing parameter; and
determining, by a computer system, a value of the not directly measureable processing parameter from the value of the directly measureable processing parameter and the relationship.

2. The method of clause 1, wherein the directly measureable processing parameter comprises a critical dimension (CD) of the feature.
3. The method of clause 1 or clause 2, wherein the feature is a feature in a resist image on the substrate.
4. The method of any of clauses 1 to 3, wherein the feature is a hot spot.
5. The method of any of clauses 1 to 4, wherein the not directly measureable processing parameter is a focus at which the portion of the substrate is exposed.
6. The method of any of clauses 1 to 4, wherein the not directly measureable processing parameter is a dose at which the portion of the substrate is exposed.
7. The method of any of clauses 1 to 6, wherein the relationship is retrieved from a database, established by an experiment or established by simulation.
8. The method of any of clauses 1 to 7, wherein the value of the not directly measureable processing parameter is determined from a median of values of the directly measureable processing parameter.
9. The method of any of clauses 1 to 8, wherein the portion has a higher probability of containing a defect than a threshold.
10. The method of any of clauses 1 to 9, wherein the portion contains a hot spot.
11. The method of any of clause 1 to 10, wherein the value of the directly measureable processing parameter is measured from one or more features in the portion.
12. The method of any of clauses 1 to 11, further comprising verifying the relationship.
13. The method of clause 12, wherein verifying the relationship comprises obtaining an image of the portion.
14. The method of clause 13, wherein the image is obtained by a scanning electron microscope or an electron beam inspection tool.
15. The method of any of clauses 12 to 14, wherein verifying the relationship comprises determining locations at which values of one or more directly measureable processing parameters are measured.
16. The method of clause 15, further comprising measuring the values of the one or more directly measureable processing parameter at the locations.
17. The method of clause 16, wherein measuring the values of the one or more directly measureable processing parameters comprises extracting edge locations from the image.
18. The method of any of clauses 1 to 17, wherein the feature is not part of a metrology target.
19. A computer program product comprising a computer readable medium having instructions recorded thereon, the instructions when executed by a computer implementing the method of any of clauses 1 to 18.
20. A method of manufacturing devices wherein a device pattern is applied to a series of substrates using a patterning process, the method including measuring at least the device pattern on at least one of the substrates, using the method of any of clauses 1 to 18, and controlling the lithographic process for later substrates in accordance with the value of the not directly measureable processing parameter of the method.
21. A system comprising:
an inspection apparatus configured to provide a beam on a device pattern on a substrate and to detect radiation redirected by the device pattern; and
the non-transitory computer program product of clause 19.
22. The system of clause 21, further comprising a lithographic apparatus, the lithographic apparatus comprising a support structure configured to hold a patterning device to modulate a radiation beam and a projection optical system arranged to project the modulated onto a radiation-sensitive substrate.
23. A method, comprising:
obtaining values of a characteristic of a plurality of features or patterns formed on a substrate by a lithography process;
obtaining a relationship between the characteristic and a processing parameter of the lithography process;
determining values of the processing parameter for each of the features or patterns based on the values of the characteristic and the relationship; and
determining, by a hardware computer system, a statistic characteristic from the values of the processing parameter.
24. The method of clause 23, wherein the characteristic relates to geometry of the features or patterns.
25. The method of clause 24, wherein the characteristic is a CD or normalized CD.
26. The method of clause 23, wherein the characteristic relates locations of the features or patterns relative to the substrate or relative to one another.
27. The method of any of clauses 23 to 26, wherein the processing parameter comprises a dose of the features or patterns.
28. The method of any of clauses 23 to 27, wherein the processing parameter comprises a focus of the features or patterns.
29. The method of any of clauses 23 to 28, wherein the statistic characteristic is a mean, a variance or standard deviation of the values of the processing parameter.
30. The method of any of clauses 23 to 29, further comprising obtaining a further statistic characteristic from values of the processing parameter for features or patterns formed by the same lithography process or a further lithography process.
31. The method of clause 30, further comprising determining whether the statistic characteristic and the further statistic characteristic satisfy, or do not satisfy, a criterion.
32. The method of clause 31, further comprising adjusting or calibrating a lithography process if the statistic characteristic and the further statistic characteristic satisfy, or do not satisfy, the criterion.
33. A computer program product comprising a computer readable medium having instructions recorded thereon, the instructions when executed by a computer implementing the method of any of clauses 23 to 32.

Embodiments of the disclosure may be implemented in hardware, firmware, software, or any combination thereof. Embodiments of the disclosure may also be implemented as instructions stored on a machine-readable medium or computer-readable medium, which may be read and executed by one or more processors. The term "machine-readable medium" or "computer-readable medium" as used herein refers to any medium that participates in providing instructions to processor 104 for execution and/or includes any mechanism configured to store or transmit information in a form readable by a machine (e.g., a computing device). Such a medium may take many forms, including but not limited to, non-volatile non-transitory media, volatile non-transitory media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, magnetic disk storage media, or any other magnetic medium, a CD-ROM, DVD or any other optical storage medium, punch cards, paper tape or any other physical medium with patterns of holes, read only memory (ROM), random access memory (RAM), a PROM, an EPROM, a FLASH-EPROM, a flash memory device or any other memory chip or cartridge, a carrier wave (e.g., electrical, optical, acoustical or other forms of propagated signals (e.g. carrier waves, infrared signals, digital signals, etc.) or any other medium from which a computer can read.

Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Although specific reference may be made in this text to the use of the patterning process and/or lithography apparatus in the manufacture of ICs, it should be understood that the patterning process and/or lithography apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

While specific embodiments of the disclosure have been described above, it will be appreciated that the embodiments may be practiced otherwise than as described.

The invention claimed is:

1. A method, comprising:
   measuring, by a measurement machine, a value of a directly measureable processing parameter of a patterning process from a portion of a physical substrate physically processed by the patterning process, the directly measureable processing parameter comprising a characteristic of a feature that is part of a device designed to be functional;
   obtaining a relationship between the directly measureable processing parameter and a not directly measureable processing parameter; and
   determining, by a hardware computer system, a value of the not directly measureable processing parameter from the value of the directly measureable processing parameter and the relationship.

2. The method of claim 1, wherein the directly measureable processing parameter comprises a critical dimension (CD) of the feature.

3. The method of claim 1, wherein the feature is a feature in a resist image on the substrate.

4. The method of claim 1, wherein the not directly measureable processing parameter is a focus at which the portion of the substrate is exposed, or is a dose at which the portion of the substrate is exposed.

5. The method of claim 1, wherein the relationship is retrieved from a database, established by an experiment or established by simulation.

6. The method of claim 1, wherein the value of the not directly measureable processing parameter is determined from a median of values of the directly measureable processing parameter.

7. The method of claim 1, wherein the portion has a higher probability of containing a defect than a threshold, or wherein the portion contains a hot spot.

8. The method of claim 1, wherein the value of the directly measureable processing parameter is measured from one or more features in the portion.

9. A computer program product comprising a non-transitory computer readable medium having instructions recorded thereon, the instructions configured to cause a computer to at least:
   obtain a measured value of a directly measureable processing parameter of a patterning process from a portion of a physical substrate physically processed by the patterning process, the directly measureable processing parameter comprising a characteristic of a feature that is part of a device designed to be functional and the measured value measured by a measurement machine;
   obtain a relationship between the directly measureable processing parameter and a not directly measureable processing parameter; and
   determine a value of the not directly measureable processing parameter from the value of the directly measureable processing parameter and the relationship.

10. A system comprising:
    an inspection apparatus configured to provide a beam on a device pattern on a substrate and to detect radiation redirected by the device pattern; and
    the non-transitory computer program product of claim 9.

11. A method, comprising:
    obtaining measured values of a characteristic of a plurality of features or patterns formed on a physical substrate by a lithography process, the measured values obtained using a measurement machine;
    obtaining a relationship between the characteristic and a processing parameter of the lithography process;
    determining values of the processing parameter for each of the features or patterns based on the values of the characteristic and the relationship;
    determining, by a hardware computer system, a statistic characteristic from the values of the processing parameter; and
    evaluating the statistic characteristic against a criterion, where the (i) statistic characteristic, (ii) the result of the evaluation, or (iii) information derived from (i) or (ii), is for control, design, modification or monitoring of a process of manufacturing devices that includes the lithography process or of a physical object or apparatus to be used in process of manufacturing devices.

12. The method of claim 11, wherein the characteristic relates to geometry of the features or patterns.

13. The method of claim 11, wherein the characteristic relates locations of the features or patterns relative to the substrate or relative to one another.

14. The method of claim 11, wherein the processing parameter comprises a dose of the features or patterns or a focus of the features or patterns.

15. The method of claim 11, wherein the statistic characteristic is a mean, a variance or standard deviation of the values of the processing parameter.

16. The method of claim 11, further comprising obtaining a further statistic characteristic from values of the processing parameter for features or patterns formed by the same lithography process or a further lithography process.

17. A computer program product comprising a non-transitory computer readable medium having instructions recorded thereon, the instructions when executed by a computer system configured to cause the computer system to at least:
obtain measured values of a characteristic of a plurality of features or patterns formed on a physical substrate by a lithography process, the measured values obtained using a measurement machine;
obtain a relationship between the characteristic and a processing parameter of the lithography process;
determine values of the processing parameter for each of the features or patterns based on the values of the characteristic and the relationship;
determine a statistic characteristic from the values of the processing parameter; and
evaluate the statistic characteristic against a criterion,
where the (i) statistic characteristic, (ii) the result of the evaluation, or (iii) information derived from (i) or (ii), is for control, design, modification or monitoring of a process of manufacturing devices that includes the lithography process or of a physical object or apparatus to be used in process of manufacturing devices.

18. The computer program product of claim 17, wherein the statistic characteristic is a mean, a variance or standard deviation of the values of the processing parameter.

19. The computer program product of claim 17, wherein the instructions are further configured to cause the computer system to obtain a further statistic characteristic from values of the processing parameter for features or patterns formed by the same lithography process or a further lithography process.

20. The computer program product of claim 9, wherein the feature is a feature in a resist image on the substrate.

* * * * *